United States Patent [19]

Kawahara

[11] 4,397,564
[45] Aug. 9, 1983

[54] ELECTRONIC TIMEPIECE
[75] Inventor: Hisashi Kawahara, Tokyo, Japan
[73] Assignee: Citizen Watch Co. Ltd., Tokyo, Japan
[21] Appl. No.: 245,522
[22] Filed: Mar. 19, 1981
[30] Foreign Application Priority Data Apr. 1, 1980 [JP] Japan .................................. 55-42111

[51] Int. Cl.³ .............................................. G04B 1/05
[52] U.S. Cl. .................................................. 368/204
[58] Field of Search .......................... 368/66, 203–204; 323/318, 325, 349–351; 5/451

[56] References Cited
U.S. PATENT DOCUMENTS 4,094,137 6/1978 Morokawa ...................... 368/204 X
4,358,728 11/1982 Hashimoto ..................... 368/204 X

*Primary Examiner*—Vit W. Miska
*Attorney, Agent, or Firm*—Birch, Stewart, Kolasch & Birch

[57] ABSTRACT

In an electronic timepiece including a circuit for setting a voltage level at which alarm is given to indicate the termination of battery lifetime, driving voltage level of a time display device of the timepiece, frequency dividing ratio by which frequency of the timepiece is determined, or the like, a selecting circuit is provided for supplying different voltage level- or frequency dividing ratio-adjusting signals. The voltage level or frequency dividing ratio is precedently set by the different adjusting signals supplied from the selecting circuit and then is fixed by means of a voltage level- or frequency dividing ratio-setting signal supplied from outside selecting terminals.

8 Claims, 3 Drawing Figures

ELECTRONIC TIMEPIECE

BACKGROUND OF THE INVENTION

1. Field of the Invention

This invention relates to an electronic timepiece, and more particularly to an electronic timepiece having a circuit for setting critical voltage level of a battery and/or frequency dividing ratio of the timepiece.

2. Description of the Prior Art

Recently, integrated circuits of low power consumption have been developed for use in electronic timepieces as they have been popularized, and it has become possible to provide electronic timepieces having a longer battery lifetime. However, it has conversely been difficult for users of such timepieces to memorize the time at which the battery should be changed. As a result, there have been proposed and popularized electronic timepieces with an indicator for battery lifetime.

An example of battery voltage detecting devices according to the prior art is shown in FIG. 1 of the accompanying drawings. This battery voltage detecting device comprises a detection level setting means 10 which may consist of a variable adjusting resistor R and a voltage level detecting circuit 11 which consists of an enhancement type N-MOS transistor 11a to be used for level detection and a data type flip-flop (hereinafter referred to as "data-type FF") 11b to be used for data memorization. The detection level setting means 10 and the voltage level detecting circuit 11 are connected in series between the terminal $V_{DD}$ of a voltage supply source and the grounded terminal $V_{SS}$. The data terminal D of the data type FF 11b is connected to the junction A between the adjusting resistor R and the N-MOS transistor 11a, and the gate terminal of the N-MOS transistor 11a and the clock terminal CL of the data type FF 11b are connected to a sampling terminal SP.

In the circuit as above explained, the data type FF 11b is a C-MOS of master-slave construction in which the detection level of the data terminal D is always at the voltage $V_{DD}/2$ and an output of this level at the data terminal D is generated at the output terminal Q at the time of occurrence of the trailing edge of the sampling pulses supplied to the clock terminal CL of the data type FF 11b.

While no sampling pulse is supplied to the sampling terminal SP, the transistor 11a is non-conductive, so that the electric potential $V_A$ at the junction A is equal to the voltage $V_{DD}$ of the voltage supply source. When the sampling pulses are supplied to the sampling terminal SP, the transistor 11a becomes conductive with the result that current will flow therethrough, so that the electric potential $V_A$ falls due to a voltage drop across the adjusting resistor R. As a result, if the voltage level or the electric potential $V_A$ is lower than the voltage $V_{DD}/2$, an output "0" will come out of the output terminal Q of the data-type FF 11b at the time of the retailing edge of the sampling pulses, while if the voltage level is higher than the voltage $V_{DD}/2$, an output "1" comes out likewise. These outputs are maintained until a detecting operation is performed by the following sampling pulse.

The operating level of the voltage level detecting circuit 11 is set in such a manner that, as the level of the potential $V_A$ at the junction A, when sampled, changes dependently upon the voltage $V_{DD}$ of the voltage supply source and the value of the adjusting resistor R, the adjusting resistor R is regulated so that the level of the potential $V_A$ will be equal to the voltage $V_{DD}/2$ under the condition that the supply voltage between the terminals $V_{DD}$ and $V_{SS}$ is set to the voltage (for example 1.4 volts) to be detected. In this prior art example, the operating level lowers as the value of the adjusting resistor R becomes higher.

In this manner, an output "0" comes out of the output terminal Q of the data type FF 11b while the voltage supplied between the terminals $V_{DD}$ and $V_{SS}$ is higher than the voltage 1.4 volts while an output "1" comes out of the output terminal Q when the voltage between those terminals reaches the voltage 1.4 volts.

However, in the conventional battery voltage detecting device as above-mentioned, the adjusting resistor R is selectively connected outside of the integrated circuit and is not expedient from the standpoint of space required for mounting such resistor and its cost. Then, it is the recent tendency of battery voltage detecting device to employ the structure wherein a plurality of adjustable resistors are provided for setting voltage level in the integrated circuit and are set by a plurality of outside terminals.

In order to set the voltage level by the plurality of outside setting terminals as above-mentioned, switches provided correspondingly to the outside terminals or a method of soldering the outside terminals to the terminal $V_{DD}$ or $V_{SS}$ on the circuit pattern of a circuit board must be relied upon. However, provision of those switches requires too much space and the soldering method may cause damages onto the outside terminals or the circuit pattern on the circuit board when these outside terminals are subjected to soldering process successively. If many outside terminals are used, it will take much more time to find out an appropriate setting level and thus the soldering method was not desirable from the standpoint of higher cost and lower quality.

SUMMARY OF THE INVENTION

It is therefore an object of the present invention to improve the above-mentioned drawbacks and to provide an electronic timepiece in which the detection level of a level detection circuit is easy to set and little time and space are required to set the detection level. According to the teachings of the present invention, these objects are attained by providing a plurality of outside selecting terminals which give a fixed setting signal and a selecting circuit which gives adjustable setting signals and by setting the detection level by means of the adjustable setting signals and then fixing the detection level by means of the fixed setting signal. Each outside selecting terminal is preferably connected to one terminal of a voltage supply source through a circuit pattern on a circuit board and one or more of the outside selecting terminals which are determined in the setting process of the detection level are removed by a punching out process to provide open-circuits of the outside selecting terminals.

Other and further objects of the invention will become obvious to those skilled in the art in the following description and the accompanying drawings in which:

DETAILED DESCRIPTION OF THE PREFERRED EMBODIMENTS

Figure 2:
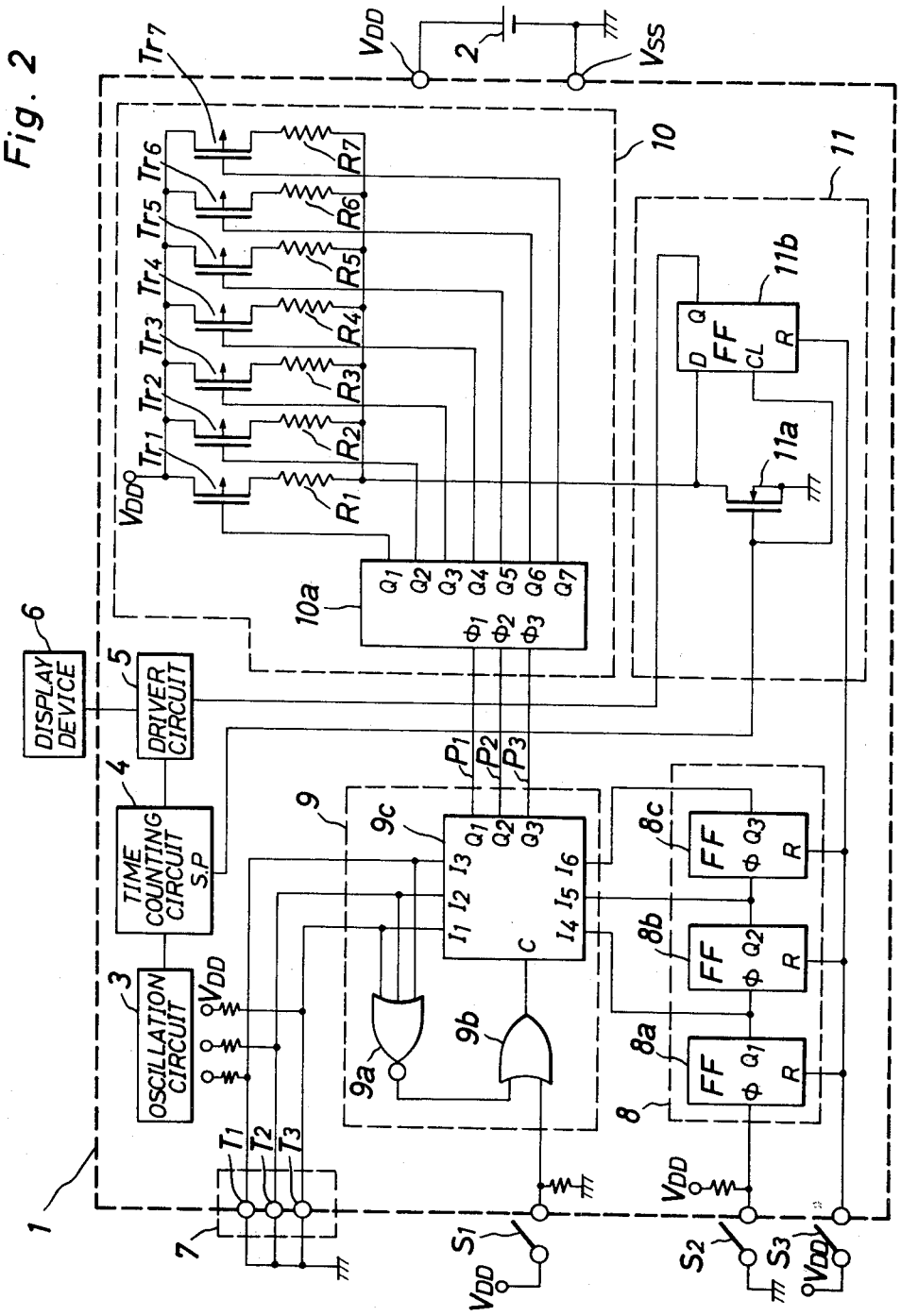
FIG. 2 is a circuit of an embodiment of an electronic timepiece according to the present invention.

Referring now to FIG. 2 of the drawings, reference numeral 1 designates a large scale integrated circuit for a timepiece with a voltage supply battery 2 of 1.5 volts connected between the terminals $V_{DD}$ and $V_{SS}$. An oscillating circuit 3 includes a crystal oscillator to provide a time standard and a time counting circuit 4 produces information representative of times, minutes and seconds in response to oscillating signals coming from the oscillating circuit 3 and simultaneously sampling signals from the terminal SP. The information is indicated as time information on a display device 6 through a driver circuit 5. An outside selecting terminal group 7 has terminals $T_1$, $T_2$ and $T_3$ all connected to the terminal $V_{SS}$ through the circuit pattern of a circuit board.

A selecting circuit 8 consists of three binary flip-flops (hereinafter referred to as "binary FF") 8a, 8b and 8c which are connected in a cascade. The binary FF 8a of the first stage has its clock terminal $\phi$ connected to one of the two contacts of a selecting switch $S_2$ having another contact which is connected to the terminal $V_{SS}$. The selecting circuit counts the number of switching signals coming from the switch $S_2$. The outputs of these binary FFs can be taken at their respective output terminals $Q_1$, $Q_2$ and $Q_3$.

A switching circuit 9 consists of a NOR gate 9a, an OR gate 9b and a switching element 9c such as transmission gate or the like. The switching circuit 9c has its input terminals $I_1$, $I_2$ and $I_3$ connected respectively to the terminals $T_1$, $T_2$ and $T_3$ of the outside selecting terminal group 7 and its another input terminals $I_4$, $I_5$ and $I_6$ connected respectively to the output terminals $Q_1$, $Q_2$ and $Q_3$ of the selecting circuit 8. The control terminal C of the switching element 9c is connected to output of OR gate 9b, one input terminal of which is connected to an output terminal of NOR gate 9a. NOR gate 9a has its input terminals connected to the terminals $T_1$, $T_2$ and $T_3$ of the outside selecting terminal group 7. Another input terminal of OR gate 9b is connected to one contact of a switch $S_3$ whose other contact is connected to the terminal $V_{DD}$. The information supplied to the input terminals $I_1$, $I_2$ and $I_3$ or $I_4$, $I_5$ and $I_6$ are selectively taken out of the output terminals $Q_1$, $Q_2$ and $Q_3$ of the switching circuit 9c in dependence upon of the input to the control terminal C.

Figure 1:
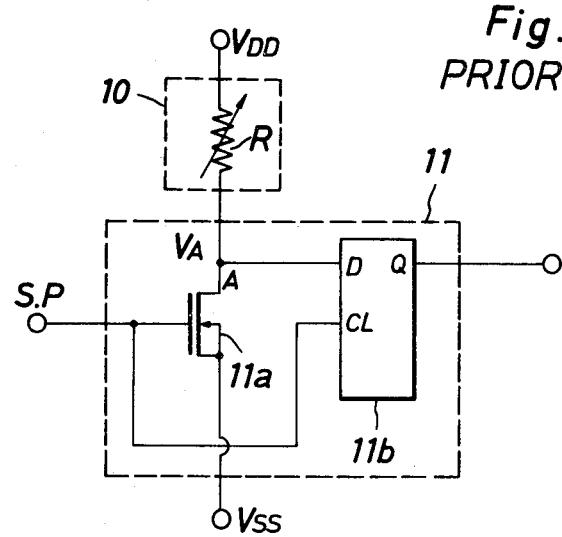
FIG. 1 is a circuit of a battery voltage detecting device according to the prior art.

A detection level setting circuit 10 which corresponds to the adjusting resistor R shown in FIG. 1 serves to set the detection level according to the information given by means of the outside selecting terminal group 7 or the selecting circuit 8. The detection level setting circuit 10 includes seven series circuits of switching transistors $Tr_1$, $Tr_2$, $Tr_3$, $Tr_4$, $Tr_5$, $Tr_6$ and $Tr_7$ and resistors $R_1$, $R_2$, $R_3$, $R_4$, $R_5$, $R_6$ and $R_7$, and these circuits are connected in parallel to each other. Values of these resistors $R_1$ to $R_7$ increase gradually in this order. These transistors $Tr_1$ to $Tr_7$ may be of the enhancement P-MOS type and their gates are connected respectively to output terminals $Q_1$, $Q_2$, $Q_3$, $Q_4$, $Q_5$, $Q_6$ and $Q_7$ of a decoder 10a whose input terminals $\phi_1$, $\phi_2$ and $\phi_3$ are connected respectively to the output terminals $Q_1$, $Q_2$ and $Q_3$ of the switching element 9c. Any one of the switching transistors $Tr_1$ to $Tr_7$ is switched on or off depending upon the output of the decoder 10a, so that the corresponding resistor of the resistors $R_1$ to $R_7$ is selected and the detection level is thus set.

Reference numeral 11 designates a voltage level detecting device and the detected output is supplied through the driver circuit 5 to the display device 6 where an alarm of battery lifetime is given.

The operation of the circuit of FIG. 2 is as follows:

In the normal operation, the oscillating circuit 3 oscillates and the time counting circuit 4 operates to count time. As a result, time is indicated in the display device 6 by the driver circuit 5. As the terminals $T_1$, $T_2$ and $T_3$ of the outside selecting terminal group 7 are connected to the terminal $V_{SS}$ on the circuit pattern of the circuit board, the outputs at these terminals $T_1$, $T_2$ and $T_3$ are all "0". Therefore, NOR gate 9a of the switching circuit 9 has a logic "1" at its output terminal, so that the signal "1" is applied through OR gate 9b to the control terminal C of the switching element 9c. Thus, the switching element 9c has at its output terminals $Q_1$, $Q_2$ and $Q_3$ the information supplied to the input terminals $I_4$, $I_5$ and $I_6$ from the output terminals $Q_1$, $Q_2$ and $Q_3$ of the selecting circuit 8 and the information is supplied to the decoder 10a of the detection level setting circuit 10 where the information is decoded. As a result, a signal "0" is derived from any one of the output terminals $Q_1$ to $Q_7$ of the decoder 10a, so that the corresponding one of the switching transistors $Tr_1$ to $Tr_7$ is turned on. In this way, the voltage detection level is set. However, since the voltage of the voltage supply source 2 is 1.5 volts which is clearly over the critical voltage 1.4 volts, the voltage level detecting circuit 11 has signal "0" at its output terminal Q of the data type FF 11b and therefore no alarm of battery lifetime is indicated in the display device 6.

In order to set the voltage detection level, a reference voltage supply source of 1.4 volts is connected between the terminals $V_{DD}$ and $V_{SS}$ and then the reset switch $S_3$ is closed to reset the selecting circuit 8 and the data type FF 11b of the voltage level detecting circuit 11 to give signals "0" at the output terminals $Q_1$, $Q_2$ and $Q_3$ of the selecting circuit 8 and at the output terminal Q of the data type FF 11b.

In this condition, the outside selecting terminal group 7 has output "0" at the terminals $T_1$, $T_2$ and $T_3$, because these terminals are connected to the terminal $V_{SS}$. As a result, a signal "1" is applied to the control terminal C of the switching element 9c, so that the switching element 9c is ready to have at its output terminals $Q_1$, $Q_2$ and $Q_3$ the information given to the input terminals $I_4$, $I_5$ and $I_6$ from the selecting circuit 8.

Now, when the selecting switch $S_2$ is switched on a single time, the binary FF 8a of the selecting circuit 8 will have a output "1" at its logic terminal $Q_1$ and thus the information given to the input terminals $I_4$ and $I_5$ and $I_6$ of the switching element 9c will be "1", "0" and "0", respectively. This information comes out of the output terminals $Q_1$, $Q_2$ and $Q_3$ of the switching element 9c as selecting signals $P_1$, $P_2$ and $P_3$ and is given to the input terminals $\phi_1$, $\phi_2$ and $\phi_3$ of the decoder 10a, so that signal "0" is derived from the output terminal $Q_1$ of the decoder 10a and the switching transistor $Tr_1$ is turned on. In this way, the voltage detection level is set by the adjusting resistor $R_1$ thus selected. At this instant, it is determined whether alarm of battery lifetime is indicated in the display device 6 or not and if no such alarm is indicated therein, the selecting switch $S_2$ is again depressed.

By the second depression of the selecting switch $S_2$, the binary FF $8b$ of the selecting circuit 8 will have output "1" at its output terminal $Q_2$ and thus the selecting signals $P_1$, $P_2$ and $P_3$ which are "0", "1" and "1" respectively are fed to the decoder $10a$. The decoder $10a$ will have at its output terminal $Q_2$ output "0" which will in turn turn on the switching transistor $Tr_2$, so that voltage detection level is set by the adjusting resistor $R_2$. At this instant, it is again seen whether alarm of battery lifetime is indicated in the display device 6 or not and if no such alarm is indicated therein, the selecting switch $S_2$ may be again depressed.

Likewise, it is seen upon depression of the selecting switch $S_2$ whether alarm of battery lifetime is indicated in the display device 6 or not. It is assumed that, when the selecting switch $S_4$ is depressed, for example four times, alarm of battery lifetime is indicated in the display device 6. At this time, the selecting signals $P_1$, $P_2$ and $P_3$ are "0", "0" and "1", respectively and the decoder $10a$ has at its output terminal $Q_4$ output "0", so that the switching transistor $Tr_4$ is turned on and the adjusting resistor $R_4$ is selected with the result that the data type FF $11b$ will have output "1" at its output terminal Q. The voltage detection level at this instant is just what is to be sought and the circuit pattern connecting the terminal $T_1$ of the outside selecting terminal group 7 and the terminal $V_{SS}$ is punched out to open-circuit the terminal $T_1$ from the terminal $V_{SS}$, because signals "0", "0" and "1" are supplied from the outside selecting terminal group 7 to the input terminals $I_1$, $I_2$ and $I_3$ of the switching element $9c$ by punching out the circuit pattern connecting the terminal $T_1$ and the terminal $V_{SS}$. At this time, the output of NOR gate $9a$ of the switching circuit 9 becomes "0" and the signal "0" is applied to the control terminal C of the switching element $9c$ through OR gate $9b$ with the result that the switching element $9c$ has at its output terminals $Q_1$, $Q_2$ and $Q_3$ the information given from the terminals $T_1$, $T_2$ and $T_3$ to the input terminals $I_1$, $I_2$ and $I_3$. As a result, the selecting signals $P_1$, $P_2$ and $P_3$ become "0", "0" and "1", respectively and the decoder $10a$ has output "0" at its output terminal $Q_4$. Thus, the switching transistor $Tr_4$ is turned on and the adjusting resistor $R_4$ is selected, so that voltage detection level is set.

The voltage detection level thus set is maintained permanently thereafter. However, if desired, it is possible to find a better setting position or to readjust the voltage detection level by closing the selecting switch $S_2$ to select the information given by the selecting circuit 8. In this way, the selecting switch $S_2$ is useful for readjustment of the voltage detection level when the level is shifted due to change in characteristics of elements used in the detection level setting circuit and so on.

Figure 3:
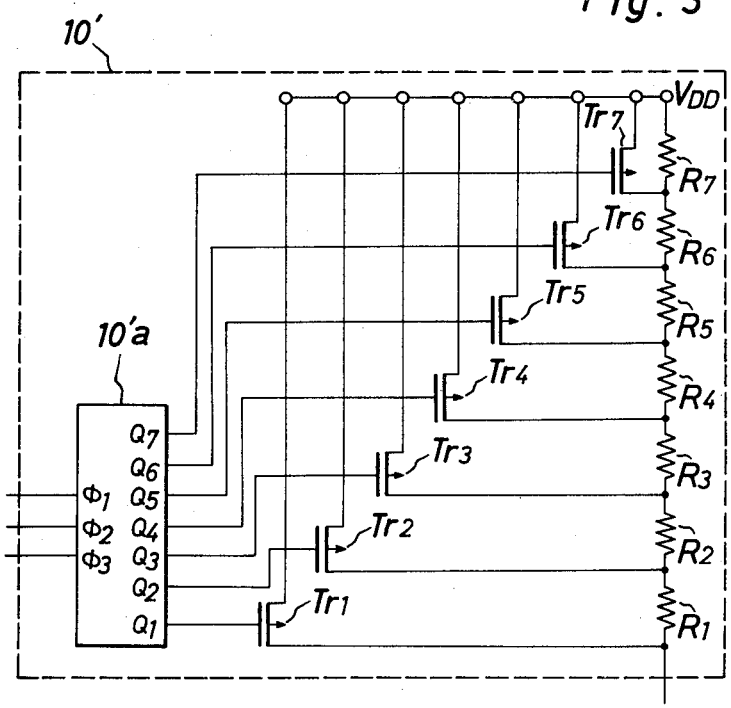
FIG. 3 is another embodiment of a detection level setting circuit shown in FIG. 2.

FIG. 3 shows another embodiment of the detection level setting circuit used in the electronic timepiece according to the invention. The detection level setting circuit $10'$ shown in FIG. 3 includes seven series-connected resistors $R_1$, $R_2$, $R_3$, $R_4$, $R_5$, $R_6$ and $R_7$, corresponding switching transistors $Tr_1$, $Tr_2$, $Tr_3$, $Tr_4$, $Tr_5$, $Tr_6$ and $Tr_7$ and a decoder $10'a$. In this embodiment, the decoder $10'a$ may be quite the same as the decoder $10a$ shown in FIG. 2 and values of the resistors $R_1$ to $R_7$ may be equal to each other. The switching transistors $Tr_1$ to $Tr_7$ are turned on one by one in sequence according to the output of the decoder $10'a$, so that the corresponding one of the resistors $R_1$ to $R_7$ is short-circuited and thus total resistance is decreased. Detection level is set in the same manner as described in connection with FIG. 2.

As is clearly seen from the above description, in an electronic timepiece wherein detection level of a voltage detection circuit is set by means of outside selecting terminals, there is provided a selecting circuit by which detection level can be set likewise the outside selecting terminals. When it is desired to set the detection level of the voltage detection circuit, the detection level is measured by means of the selecting circuit and then set by the outside selecting terminals according to the result of the previously measurement. According to the invention, it is possible to measure the detection level promptly by means of an electrical means and the outside selecting terminals need not be manipulated in the measurement of the detection level. Therefore, the present invention is very advantageous in mass producibility, stability of quality, and reduction in labor of the production of electronic timepieces with alarm function of battery lifetime.

It is to be understood that, although the invention has been described in connection with detection of critical voltage of a battery used in the electronic timepiece, the invention should not be limited thereto, but clearly applicable to other setting of parameters by means of terminals of integrated circuits such as setting of frequency, dividing ratio which determines the frequency of the timepiece, detection level of temperature which influences operation of the timepiece and driving voltage level of display devices such as a liquid cristal display panel, without departing from the spirit and scope of the invention.

What I claim is:
1. Electronic timepiece comprising:
   a level setting circuit whose level is set by a level setting signal supplied from a plurality of outside selecting terminals,
   a selecting circuit for supplying different level adjusting signals, and
   a switching circuit for switching said level setting signal and said level adjusting signals to selectively supply either of said signals to said level setting circuit, wherein a desired level is set by said level adjusting signals and then is fixedly set by selecting said outside selecting terminals.
2. Electronic timepiece as set forth in claim 1 wherein said outside selecting terminals are connected to one terminal of a voltage supply source before the level of said level setting circuit is fixedly set.
3. Electronic timepiece as set forth in claim 1 wherein said selecting circuit comprises a switch and counting means for counting the number of times of closure of said switch and for supplying level adjusting signals based upon said number of times of closure.
4. Electronic timepiece as set forth in claim 3 wherein said selecting circuit includes a reset switch for resetting said counting means.
5. Electronic timepiece as set forth in claim 1 wherein said switching circuit includes a detecting means for detecting the level setting signal supplied from said outside selecting terminals, and
   wherein said switching operation of said switching circuit is controlled by said detecting means.
6. Electronic timepiece as set forth in claim 1 wherein said switching circuit includes a manually operated switch for controlling the switching operation of the switching circuit.

7. Electronic timepiece as set forth in claim 1 wherein said level setting circuit includes a plurality of fixed resistors, a plurality of switching means for selecting said fixed resistors when switched on, and a control circuit for controlling the switching-on and -off of said switching means in response to the level adjusting signal or the level setting signal supplied from said switching circuit.

8. Electronic timepiece as set forth in claim 1 wherein said level setting circuit is designed for detection of voltage of a battery used in the electronic timepiece.

* * * * *